United States Patent
Choi et al.

[19]

[11] Patent Number: 6,055,200
[45] Date of Patent: Apr. 25, 2000

[54] VARIABLE TEST VOLTAGE CIRCUITS AND METHODS FOR FERROELECTRIC MEMORY DEVICES

[75] Inventors: Mun-Kyu Choi; Yeon-Bae Chung, both of Kyunggi-do, Rep. of Korea

[73] Assignee: Samsung Electronics Co., Ltd., Rep. of Korea

[21] Appl. No.: 09/273,891

[22] Filed: Mar. 22, 1999

[30] Foreign Application Priority Data

Nov. 7, 1998 [KR] Rep. of Korea ............... 98-47704

[51] Int. Cl.⁷ ........................................ G11C 7/00
[52] U.S. Cl. ............................. 365/201; 365/145
[58] Field of Search ........................ 365/201, 145; 324/765, 769; 714/718

[56] References Cited

U.S. PATENT DOCUMENTS

| | | | |
|---|---|---|---|
| 4,800,332 | 1/1989 | Hutchins | 324/73 |
| 5,677,865 | 10/1997 | Seyyedy | 365/145 |
| 5,751,628 | 5/1998 | Hirano et al. | 365/145 |
| 5,959,922 | 9/1999 | Jung | 365/210 |

Primary Examiner—Richard T. Elms
Assistant Examiner—Anh Phung
Attorney, Agent, or Firm—Myers Bigel Sibley & Sajovec

[57] ABSTRACT

Variable test voltage circuits and methods are provided for ferroelectric memory devices. The ferroelectric memory devices include a first bit line, a word line, a nonvolatile memory cell at an intersection of the first bit line and the word line, a second bit line corresponding to the first bit line and a sense amplifier connected between the first and second bit lines to sense a voltage difference between the first and second bit lines. Test circuits and methods receive a variable test voltage and force at least one of the first and second bit lines to the variable test voltage in response to control signals during a test mode of operation. The ferroelectric memory may also include a reference cell including a ferroelectric capacitor, wherein the reference cell supplies a reference voltage to the second bit line. The test circuits and methods also may be responsive to deselection of the word line to force the first bit line to the variable test voltage. The test circuits and methods also may be responsive to deselection of the reference cell to force the second bit line to the variable test voltage. The test circuits and methods also may be responsive to control signals during a test mode of operation to receive first and second variable test voltages and force the first and second bit lines to the first and second test voltages respectively, in response to deselection of the nonvolatile memory cell and the reference cell to thereby supply the first and second bit lines with the first and second test voltages.

33 Claims, 6 Drawing Sheets

VARIABLE TEST VOLTAGE CIRCUITS AND METHODS FOR FERROELECTRIC MEMORY DEVICES

FIELD OF THE INVENTION

The present invention relates to nonvolatile integrated circuit memory devices and more particularly to circuits and methods for testing ferroelectric memory devices.

BACKGROUND OF THE INVENTION

Ferroelectric memory devices use ferroelectric material for a memory cell capacitor to provide nonvolatile memory devices. A ferroelectric capacitor has hysteresis properties, so that a remanent polarization of different polarity according to the electric field history remains even if the electric field is zero. Therefore, a nonvolatile memory device can be implemented by representing stored data by the remanent polarization of the ferroelectric capacitor. It is known to use $KNO_3$, $PbLa_2O_3$—$ZrO_2$—$TiO_2$, and $PbTiO_3$—$PbZrO_3$, and other materials as the ferroelectric material that forms the capacitor.

In U.S. Pat. No. 4,873,664, two types of ferroelectric memory devices are disclosed. In a first type, a memory cell comprises one transistor and one capacitor per bit (hereinafter, referred to as "1T/1C"). One dummy memory cell (also referred to as a reference cell) is provided for, for example, 256 main memory cells (also referred to as normal cells). In a second type, a memory cell comprises two transistors and two capacitors per bit (hereinafter, referred to as "2T/2C"), and a dummy memory cell is not provided therein. Complementary data is stored in a pair of ferroelectric capacitors.

According to the above-mentioned 1T/1C type ferroelectric memory device, a reference memory cell capacitor may have, for example, twice the capacitance (that is, twice the area) of a main memory cell capacitor. Also, the size of the reference memory cell capacitor is different from that of the main memory cell capacitor. Thus, the size may be determined according to the performance of the ferroelectric capacitor.

In a conventional 1T/1C type ferroelectric memory device, the size of a reference memory cell capacitor may be set differently from that of a main memory cell capacitor. However, the operational margin may be reduced, particularly at low voltage, due to the performance variation and voltage dependency of the ferroelectric capacitor. In the 2T/2C type ferroelectric memory device, operation may be stable at low voltage, but the memory cell area for one bit may be almost twice that of the 1T/1C type.

In addition, in conventional 2T/2C type or 1T/1C type devices, it may be difficult to perform a margin test of the performance of a ferroelectric capacitor. Thus, it may be difficult to remove a ferroelectric capacitor having low performance. It would be desirable to provide circuits and methods for testing the performance margin of a ferroelectric capacitor.

SUMMARY OF THE INVENTION

It is therefore an object of the present invention to provide test circuits and methods for ferroelectric memory devices, by which performance margins of ferroelectric capacitors in the device can be tested.

It is another object of the present invention to provide test circuits and methods for ferroelectric memory devices, by which a sensing margin for sense amplifiers can be tested.

These and other objects are provided, according to the invention, by variable test voltage circuits and methods for ferroelectric memory devices. The ferroelectric memory devices include a first bit line, a word line, a nonvolatile memory cell at an intersection of the first bit line and the word line, a second bit line corresponding to the first bit line and a sense amplifier connected between the first and second bit lines to sense a voltage difference between the first and second bit lines. Test circuits and methods receive a variable test voltage and force at least one of the first and second bit lines to the variable test voltage in response to control signals during a test mode of operation.

The ferroelectric memory may also include a reference cell including a ferroelectric capacitor, wherein the reference cell supplies a reference voltage to the second bit line. The test circuits and methods also may be responsive to deselection of the word line to force the first bit line to the variable test voltage. The test circuits and methods also may be responsive to deselection of the reference cell to force the second bit line to the variable test voltage. The test circuits and methods also may be responsive to control signals during a test mode of operation to receive first and second variable test voltages and force the first and second bit lines to the first and second test voltages respectively, in response to deselection of the nonvolatile memory cell and the reference cell to thereby supply the first and second bit lines with the first and second test voltages.

The test circuits and methods are preferably provided on the integrated circuit memory device and preferably are responsive to control signals and variable test voltages from external of the integrated circuit memory device. Accordingly, circuits and methods for testing the performance margins of ferroelectric capacitors and sense amplifiers in integrated circuit ferroelectric memory devices are provided.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENTS

Figure 1:
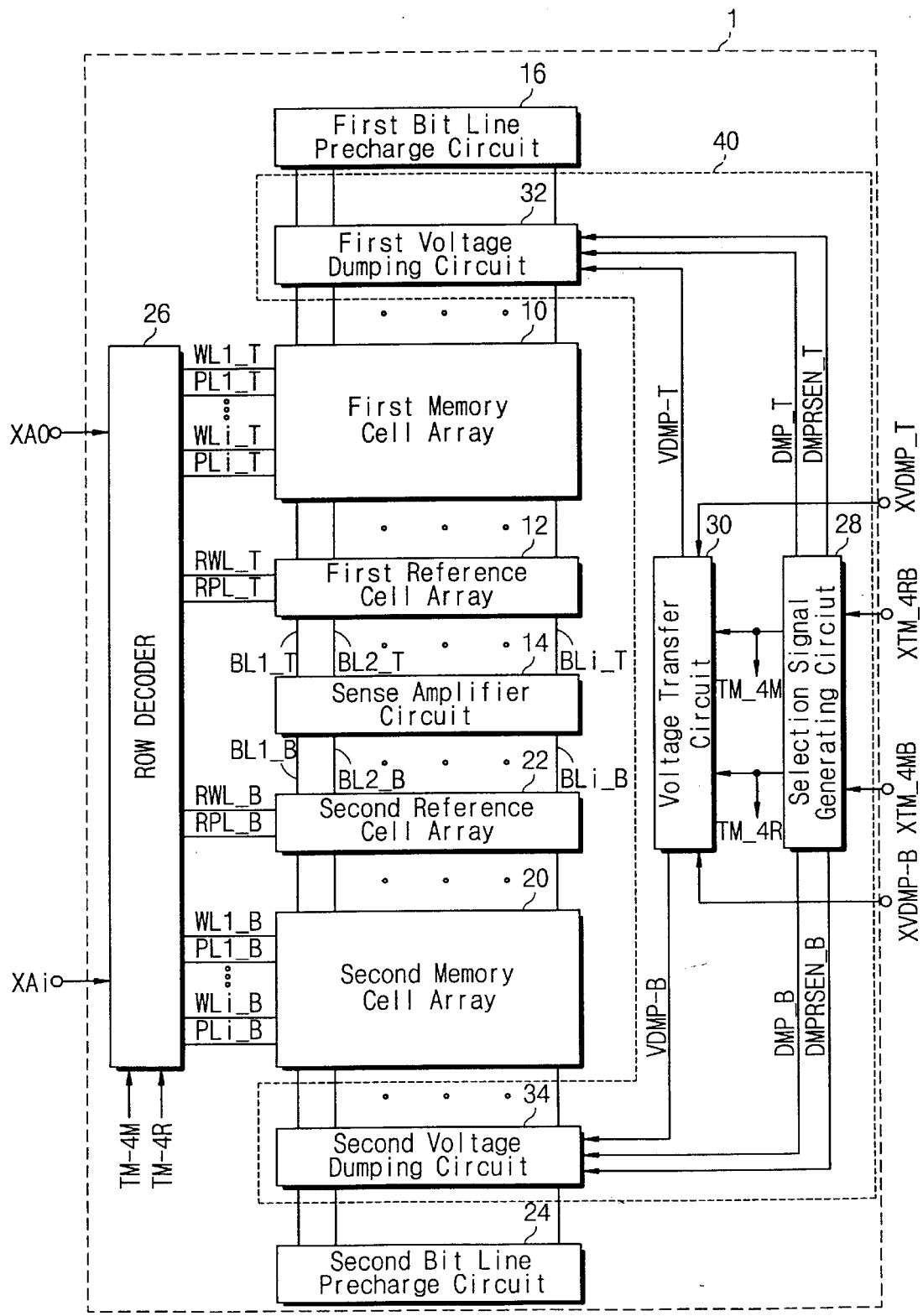
FIG. 1 shows a block diagram of a ferroelectric memory device according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another elements, there are no intervening elements present. Moreover, each embodiment described and illustrated herein includes its complementary conductivity type embodiment as well.

FIG. 1 shows a block diagram of a ferroelectric memory device 1 according to the present invention. An on-chip test circuit 40 includes a selection signal generating circuit 28, a voltage transfer circuit 30, a first voltage dumping circuit 32 and a second voltage dumping circuit 34. Circuits and methods of the invention allow performance margins of ferroelectric capacitors in a memory cell array and a reference cell array and sensing margins for a sense amplifier circuit to be tested (or evaluated), so that reliability and/or yield of the device can be improved.

The ferroelectric memory device 1 uses an open bit line scheme well-known to one skilled in the art. It also uses a folded bit line scheme, which is disclosed in U.S. Pat. No. 5,541,872, entitled "Folded Bit Line Ferroelectric Memory Device," the disclosure of which is hereby incorporated herein by reference.

Referring to FIG. 1, the device 1 comprises a first memory cell array 10, a first reference cell array 12, and a first bit line precharge circuit 16, which are arranged at a first (shown in FIG. 1 as the top side) side of a sense amplifier circuit 14 and are tied to plural bit lines BL1_T to BLi_T (where i is an integer more than 2). The first memory cell array 10 has plural word lines WL1_T to WLi_T and plural plate lines PL1_T to PLi_T each corresponding to the word lines WL1_T to WLi_T, and the first reference cell array 12 has a reference word line RWL_T and a reference plate line RPL_T corresponding to the reference word line RWL_T.

The ferroelectric memory device 1 further comprises a second memory cell array 20, a second reference cell array 22, and a second bit line precharge circuit 24, which are arranged at a second side opposite the first side (shown in FIG. 1 as the bottom side) of the sense amplifier circuit 14 and are coupled to plural bit lines BL1_B to BLi_B. The second memory cell array 20 has plural word lines WL1_B to WLi_B and plural plate lines PL1_B to PLi_B each corresponding to the word lines WL1_B to WLi_B, and the second reference cell array 22 has a reference word line RWL_B and a reference plate line RPL_B corresponding to the reference word line RWL_B.

According to above-described configuration, during each mode of operation, when the first memory cell array 10 is selected by a row decoder circuit 26, the second memory cell array 20 and the first reference cell array 12 are deselected thereby. The second reference cell array 22 serves as a reference circuit for supplying the bit lines BL1_B to BLi_B with reference voltages during each mode of operation. Conversely, when the second memory cell array 20 is selected by the row decoder circuit 26, the first memory cell array 10 and the second reference cell array 22 are deselected thereby. The first reference cell array 12 supplies the bit lines BL1_T to BLi_T with reference voltages during each mode of operation. The first bit line precharge circuit 16 precharges the bit lines BL1_T to BLi_T at a predetermined voltage (for example, ground voltage (0 V)), and the second bit line precharge circuit 24 precharges the bit line BL1_B to BLi_B at the predetermined voltage.

An example of the row decoder circuit 26 is disclosed in U.S. Pat. No. 5,218,566, entitled "Dynamic Adjusting Reference Voltage For Ferroelectric Circuits," the disclosure of which is hereby incorporated herein by reference, and need not be described further herein.

Referring again to FIG. 1, the ferroelectric memory device 1 further comprises a circuit 40 for testing a performance margin of each ferroelectric capacitor provided in the first memory cell and reference cell arrays 10 and 12 and the second memory cell and reference cell arrays 20 and 22, and for testing a sensing margin of the sense amplifier circuit 14. The circuit 40 also can practice methods according to the invention.

The test circuit (also referred to as an on-chip test circuit) 40, which is integrated in the device 1, comprises a selection signal generating circuit 28, a voltage transfer circuit 30, a first voltage dumping circuit 32, and a second voltage dumping circuit 34. The test circuit 40 supplies bit lines BL1_T to BLi_T or BL1_B to BLi_B with a variable test voltage VDMP_T or VDMP_B from external of the integrated circuit when a margin test for performance of ferroelectric capacitors in each array 10, 12, 20, and 22 is performed. Also, the test circuit 40 supplies bit lines BL1_T to BLi_T and BL1_B to BLi_B with variable test voltages VDMP_T and VDMP_B from external of the integrated circuit when the sensing margin of the sense amplifier circuit 14 is tested.

For example, when the margin test for ferroelectric capacitors in the first memory cell array 10 is carried out, the test circuit 40 deactivates the second reference cell array 22 by controlling the row decoder circuit 26, and then supplies the variable test voltage, for example, VDMP_B, into the bit lines BL1_B to BLi_B as reference voltages. Next, the margin for performance of the ferroelectric capacitors in the first memory cell array 10 may be evaluated through the sense amplifier circuit 14 by externally adjusting the test voltage VDMP_B level. Herein, as set forth above, when the first memory cell array 10 is selected during a normal mode of operation, the first reference cell array 12 and the second memory cell array 20 all are deselected through the row decoder circuit 26 (that is, there are no selected word lines and reference plate lines in each array). Like the normal mode of operation, all of the arrays 12 and 20 may be deselected during the test mode of operation.

When the margin test for ferroelectric capacitors in the second memory cell array 20 is carried out, the test circuit 40 deactivates the first reference cell array 12 by controlling the row decoder circuit 26, and then supplies the variable test voltage, for example, VDMP_T, into the bit lines BL1_T to BLi_T as reference voltages. Next, the margin for performance of the ferroelectric capacitors in the second memory cell array 20 may be tested through the sense amplifier circuit 14 by externally varying the test voltage VDMP_T level. Herein, when the second memory cell array 20 is selected during the normal mode of operation, the first memory cell array 10 and the second reference cell array 22 are all deselected through the row decoder circuit 26. Like the normal mode of operation, all of those may be deselected during the test mode of operation.

Furthermore, a sensing margin for the sense amplifier circuit 14 can be inspected or tested through the test circuit 40. That is, the arrays 10, 12, 20, and 22 all are deselected, and then a capability for sensing a voltage difference between bit lines, for example, BLi_T and BLi_B is examined or tested by supplying variable test voltages VDMP_T and VDMP_B from external to the device onto the bit lines BL1_T to BLi_T and BL1_B to BLi_B, respectively.

By the aforementioned test circuit and method 40 according to the present invention, a margin for performance of ferroelectric capacitors in the arrays 10, 12, 20, and 22 can be tested, so that a ferroelectric capacitor having low performance can be removed by screening. Also, a sensing margin for the sense amplifier circuit 14 can be inspected by using the on-chip test circuit 40.

Figure 2A:
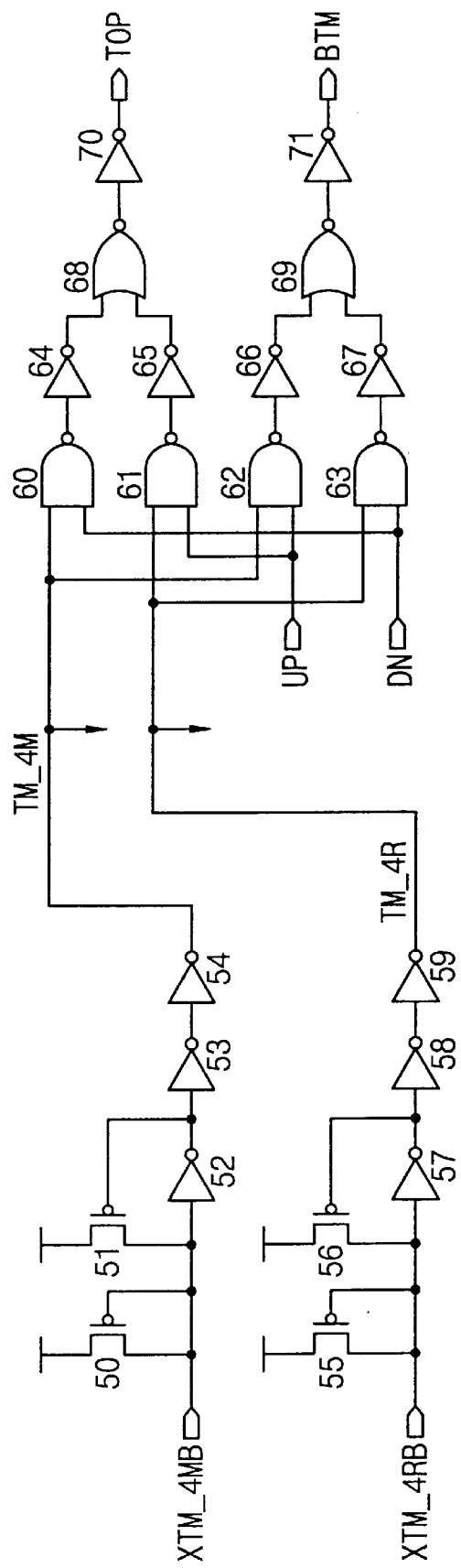
FIG. 2 is a block diagram consisting of FIGS. 2A and 2B, and FIGS. 2A and 2B are detailed circuit diagrams showing a selection signal generating circuit of a test circuit according to the preferred embodiment of the present invention.
Figure 2B:
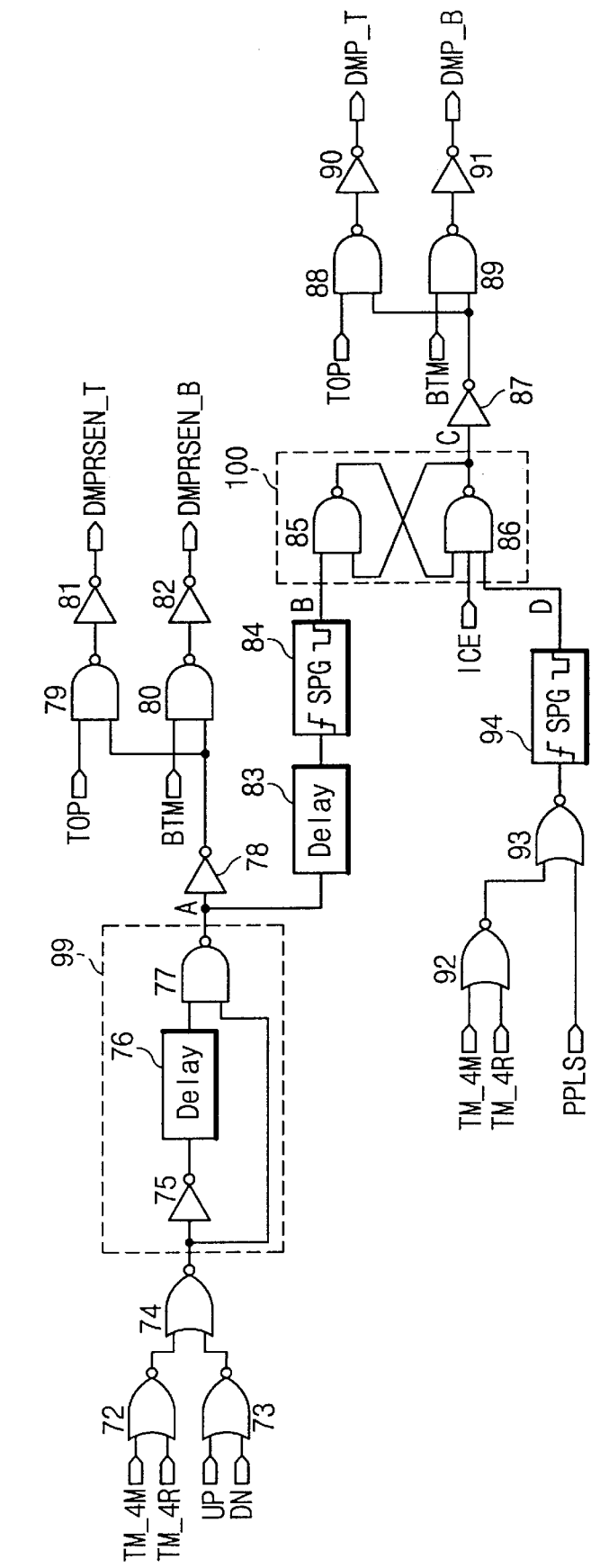
Figure 3:
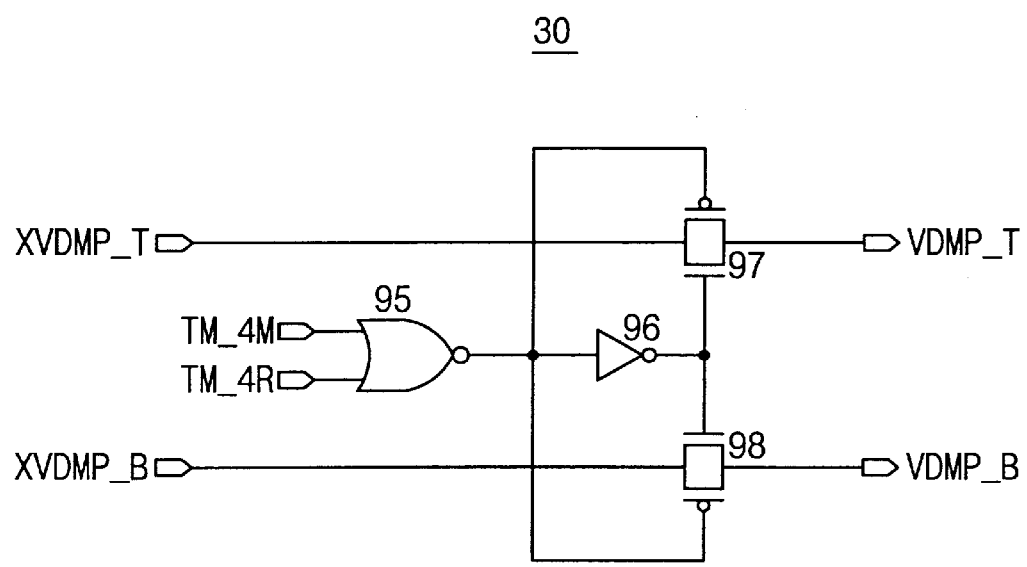
FIG. 3 shows a detailed circuit diagram of a voltage transfer circuit in FIG. 1 according to the present invention.

A detailed circuit diagram of a selection signal generating circuit 28 of the test circuit 40 according to the preferred embodiment of the present invention is depicted in FIGS. 2A and 2B. FIG. 3 shows a detailed circuit diagram of a voltage transfer circuit 30 in FIG. 1 according to the present invention.

Referring to FIG. 2A, two signals XTM_4MB and XTM_4RB are applied from exterior of the ferroelectric memory device 1, to select at least one of memory cell arrays 10 and 20 and reference cell arrays 12 and 22. Two signals UP and DN are internally generated in a well-known manner in the art using an open bit line scheme according to the present invention. Signal ICE is a signal indicating a chip enable state. In FIG. 3, two voltages XVDMP_T and XVDMP_B are variable test voltages supplied from exterior of the chip.

According to the present invention, first to fifth test modes of operation may be provided. In the first test mode of operation, a margin for performance of ferroelectric capacitors in the first memory cell array 10 shown in FIG. 1 is evaluated by using the test circuit 40, and in the second test mode of operation, a margin for performance of those in the second memory cell array 20 illustrated in FIG. 1 is evaluated thereby. In the third test mode of operation, a margin for performance of ferroelectric capacitors in the first reference cell array 12 shown in FIG. 1 is evaluated through the test circuit 40 in FIG. 1, and in the fourth test mode of operation, a margin for performance of those in the second reference cell array 22 illustrated in FIG. 1 is tested. Finally, in the fifth test mode of operation, a sensing margin for the sense amplifier circuit 14 is evaluated by using the test circuit 40.

The test circuit 40 operation according to each mode of operation will be described below with reference to FIGS. 2A, 2B and 3.

In the first test mode of operation, that is, when the first memory cell array 10 is tested, the signal XTM_4MB is activated from a 'H' level to a 'L' level and the signal XTM_4RM remains at an deactivated state, that is, the 'H' level. This makes an output TM_4M of an invertor 54 become the 'H' level and an output TM_4R of an invertor 59 become the 'L' level. During the first test mode of operation, the signal UP becomes the 'H' level and the signal DN becomes the 'L' level. Only an output of a NAND gate 62 goes from the 'H' level to the 'L' level, and other NAND gates 60, 61, and 63 each output the 'H' level, so that a signal BTM from an invertor 71 goes to the 'H' level from the 'L' level and a signal TOP from an invertor 70 remains at the 'L' level.

When the signals TM_4M and UP become the 'H' level, an output of a NOR gate 74 goes from the 'L' level to the 'H' level, and then a pulse generator 99 generates a signal A that changes from the 'H' level to the 'L' level. Before this time, input signals TOP and BTM of each of two NAND gates 79 and 80 have become the 'L' level and the 'H' level, respectively. Therefore, when the signal A from the short pulse generator 99 becomes the 'L' level, the NAND gates 79 and 80 each receive the signal A via an invertor 78 output a signal DMPRSEN_T of the 'L' level and a signal DMPRSEN_B of the 'H' level through corresponding investors 81 and 82, respectively.

A short pulse generator 84 receives the signal A of the 'L' level through a delay circuit 83, and then generates a signal B of an active low pulse when the signal A of a pulse form goes to the 'H' level from the 'L' level. This causes an output signal C of a latch circuit 100 to go from the 'H' level to the 'L' level. Before this time, input signals TOP and BTM of each of two NAND gates 88 and 89 have become the 'L' level and the 'H' level, respectively. Therefore, when the signal C becomes the 'L' level, the NAND gates 88 and 89 each receiving the signal C via an invertor 87 output a signal DMP_T of the 'L' level and a signal DMP_B of the 'H' level through corresponding invertors 90 and 91, respectively.

After the first test mode of operation has been completed under such a condition, a signal PPLS goes to the 'L' level from the 'H' level in pulse form. This causes an output signal D of a short pulse generator 94 to become the 'L' level, and then the output signal C of the latch circuit 100 becomes the 'H' level. As a result, the signal DMP_B is deactivated at the 'L' level. That is, the latch circuit 100 is reset and the signals DMP_T and DMP_B are all deactivated.

In the second test mode of operation, that is, when a margin for performance of ferroelectric capacitors of the second memory cell array 20 is evaluated, the signals XTM_4MB and DN are activated and the signals XTM_4RB and UP are deactivated. This makes the signal TOP become the 'H' level and the signal BTM become the 'L' level. As already described above, the signals DMPRSEN_T and DMP_T are activated at the 'H' level, and the signals DMPRSEN_B and DMP_B are deactivated at the 'L' level. After the second memory cell array 20 has been tested through the first voltage dumping circuit 32, the activated signal DMP_T is also deactivated in the same manner as the first test mode of operation.

In the third test mode of operation, that is, when ferroelectric capacitors of the first reference cell array 12 are tested, the signals XTM_4RB and DN are activated and the signals XTM_4MB and UP are deactivated, so that like the first test mode of operation, the signal TOP becomes the 'L' level and the signal BTM becomes the 'H' level. As a result, the signals DMPRSEN_B and DMP_B are activated at the 'H' level and the signals DMPRSEN_T and DMP_T are deactivated at the 'L' level. After the first reference cell array 12 has been tested through the second voltage dumping circuit 34, the activated signal DMP_B is also deactivated in the same manner as the first test mode of operation.

In the fourth test mode of operation, that is, when a margin for performance of ferroelectric capacitors of the second reference cell array 22 is estimated, the signals XTM_4RB and UP are activated and the signals XTM_4MB and DN are deactivated, so that like the first test mode of operation, the signal BTM becomes the 'L' level and the signal TOP becomes the 'H' level. As a result, the signals DMPRSEN_B and DMP_B are activated at the 'H' level and the signals DMPRSEN_T and DMP_T are deactivated at the 'L' level. The activated signal DMP_B is also deactivated in the same manner as the first test mode of operation.

In the fifth test mode of operation, that is, when a sensing margin of the sense amplifier circuit 14 is tested, the signals XTM_4MB XTM_4RB are all activated and either of the signals UP and DN is activated. This makes the signals TOP and BTM become the 'H' level, so that all of the signals DMPRSEN_T. DMPRSEN_B, DMP_T, and DMP_B are activated at the 'H' level.

The levels of the signals XTM_4MB, XTM_4RB, UP, DN, DMPRSEN_T, DMPRSEN_B, DMP_T, and DMP_B according to the first to fifth test modes of operation are summarized as follows:

|  | first mode of operation | second mode of operation | third mode of operation | fourth mode of operation | fifth mode of operation |
| --- | --- | --- | --- | --- | --- |
| XTM_4MB | L | L | H | H | L |
| XTM_4RB | H | H | L | L | L |
| UP | H | L | L | H | H(L) |
| DN | L | H | H | L | L(H) |
| DMPRSEN_T | L | H | L | H | H |
| DMPRSEN_B | H | L | H | L | H |
| DMP_T | L | H | L | H | H |
| DMP_B | H | L | H | L | H |

Figure 4:
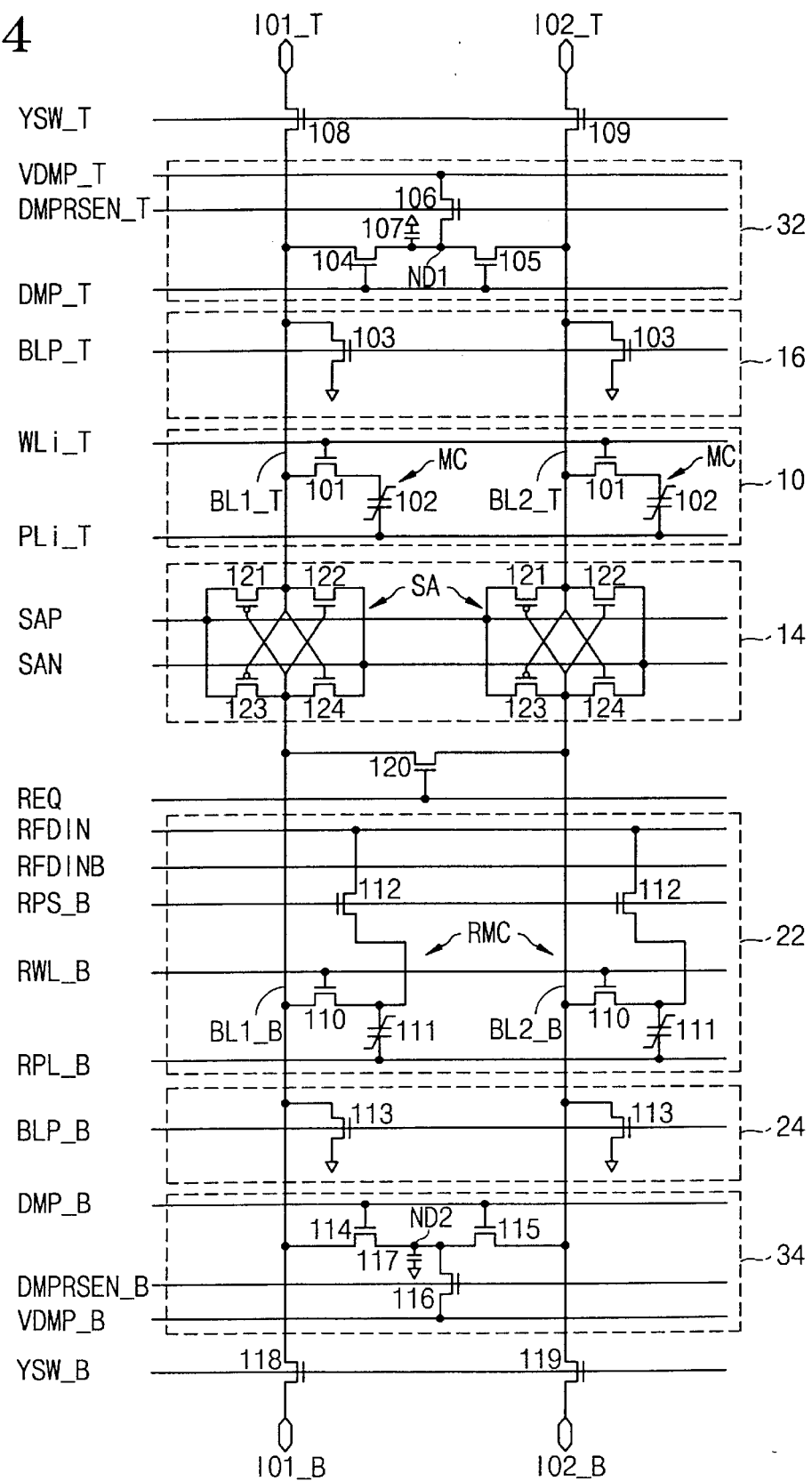
FIG. 4 is a detailed circuit diagram showing both first and second voltage dumping circuits and a part of both a first memory cell array and a second reference cell array according to the preferred embodiment of the present invention.

Referring to FIG. 4, a detailed circuit diagram showing both first and second voltage dumping circuits 32 and 34 and a part of both the first memory cell array 10 and the second reference cell array 22 according to a preferred embodiment of the present invention is illustrated. In FIG. 4, components associated with four bit lines BL1T, BL2_T, BL1_B, and BL2_B are depicted, but those associated with other bit lines are identical to those in FIG. 4.

For convenience, components associated with a pair of bit lines BL1_T and BL1_B will be explained. As shown in FIG. 4, the first memory cell array 10 has an 1T/1C type memory cell MC consisting of a switching transistor 101 and a ferroelectric capacitor 102. The switching transistor 101 has one current electrode coupled to the bit line BL1_T, a gate connected to a corresponding word line WLi_T and the other current electrode connected to a plate line PLi_T corresponding to the word line WLi_T through the ferroelectric capacitor 102. A transistor 103 comprising the first bit line precharge circuit 16 has a current path formed between the bit line BL1_T and ground and is switched on/off by a signal BLP_T.

The first voltage dumping circuit 32, according to the present invention, supplies bit lines BL1_T and BL2_T with a variable test voltage VDMP_T through a voltage transfer circuit 30 of FIG. 3 from external of the device in response to selection signals DMPRSEN_T and DMP_T from the selection signal generating circuit 28. The circuit 32 comprises three NMOS transistors 104, 105 and 106 and one capacitor 107. Current paths of the transistors 104 and 105 are formed in series between the bit lines BL1_T and BL2_T, and their gates receive the selection signal DMP_T in common. The transistor 106 whose gate receives the selection signal DMPRSEN_T is connected to the test voltage VDMP_T and a node ND1 between the current paths of the transistors 104 and 105. The capacitor 107, for example, a MOS capacitor or a junction capacitor, is connected between the node ND1 and the ground. The first voltage dumping circuit 32 thus connected is provided between bit lines, for example, BL(i-1)_T and BLi_T, respectively, although not shown in FIG. 4.

With reference to FIG. 4, the second reference cell array 22 has a pair of reference cells RMC each including a switching transistor 110 and a ferroelectric capacitor 111. In this embodiment, the ferroelectric capacitors 111 have different polarization states from each other, but have the same size as those of the first memory cell array 10. The switching transistor 110 whose gate is connected to a reference word line RWL_B has one current electrode connected to the bit line BL1_B and the other current electrode coupled to the reference plate line RPL_B through the ferroelectric capacitor 111. Furthermore, at the connection between the other current electrode of the transistor 110 and the ferroelectric capacitor 111 associated with the bit line BL1_B/BL2_B, there is coupled one current electrode of an NMOS transistor 112 switched on/off by a signal RPS_B and having the other current electrode tied to a line RFDIN/RFDINB.

Although not shown in FIG. 4, the reference cells RMC thus connected are provided between bit lines, for example, BL(i-1)_B and BLi_T.

Like the first bit line precharge circuit 16, at each bit line BLi_B, an NMOS transistor 113 comprising the second bit line precharge circuit 24 is coupled. Its gate receives a signal BLP_B and its source is grounded.

As shown in FIG. 4, the second voltage dumping circuit 34 is provided at the bottom side where the bit lines BL1_B and BL2_B are arranged. The circuit 34 provides a variable test voltage VDMP_B through the voltage transfer circuit 30 of FIG. 1 from external of the device in response to the selection signals DMPRSEN_B and DMP_B applied from the selection signal generating circuit 28 of FIG. 1 or FIG. 2B. The circuit 34 is comprised of three NMOS transistors 114, 115, and 116 and one capacitor 117. Current paths of the transistors 114 and 115 are formed in series between the bit lines BL1_B and BL2_B, and their gates receive the selection signal DMP_B in common. The transistor 116 whose gate receives the selection signal DMPRSEN_B is connected to the test voltage VDMP_B and a node ND2 between the current paths of the transistors 114 and 115. The capacitor 117 is connected between the node ND2 and ground. Although not shown in FIG. 4, the second voltage dumping circuit 34 thus connected is provided between bit lines, for example, BL(i-1) B and BLi_B, respectively.

Between each pair of bit lines, for example, BL1_T and BL1_B, and BL2_T and BL2_B, a sense amplifier SA is connected which senses and amplifies a voltage difference between each bit line pair. Each of the sense amplifiers SA includes two PMOS transistors 121 and 123 and two NMOS transistors 122 and 124 connected as illustrated in FIG. 4.

Although not shown in FIG. 4, the circuit patterns which are associated with the bit lines BL1_T, BL1_B, BL2_T, and BL2_B are repeated in the row direction. Also, a first reference cell array 12 which is identical to the second reference cell array 22 of FIG. 4 may be arranged at the top side, and a second memory cell array 20 which is identical to the first memory cell array 10 of FIG. 4 may be arranged at the bottom side.

Figure 5:
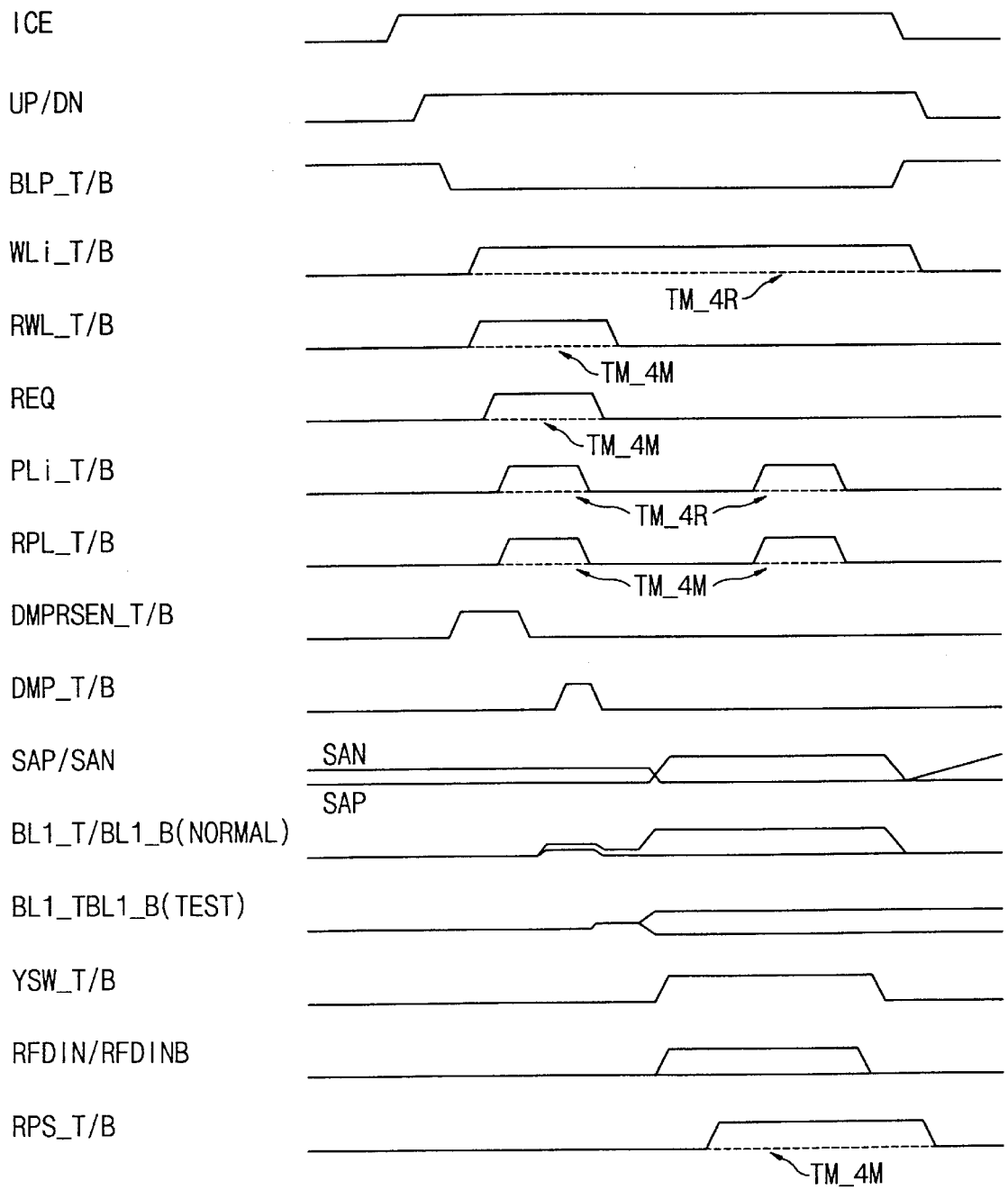
FIG. 5 is a timing diagram for describing test modes of operation according to the present invention.

FIG. 5 is a timing diagram for describing test modes of operation according to the present invention. For convenience, operation of present invention associated with two pairs of bit lines BLi_T, BL2_T, BL1_B, and BL2_B is described, but those associated with other bit lines are identical to the two pairs of bit lines BL1_T, BL2_T, BL1_B, and BL2_B.

The first test mode of operation in which a margin for performance of ferroelectric capacitors in the first memory cell array 10 is evaluated now will be described. As set forth above, during the first mode of operation, the first memory cell array 10 is selected through the row decoder circuit 26 (data stored in each memory cell of the first memory cell array 10 are read out), and the second memory cell array 20 and the first reference cell array 12 are deselected through the row decoder circuit 26. Prior to the test operation performance, bit lines BL1_T to BLi_T and BL1_B to BLi_B are precharged at a predetermined level (for example, 0 volts) by means of the first and second bit line precharge circuits 16 and 24 in accordance with the signals BLP_T/B of the 'H' level.

As shown in FIG. 5, the signal ICE goes to the 'H' level from the 'L' level, so that the latch circuit 100 of FIG. 2B is reset. During the first test mode of operation, as illustrated in the above-mentioned chart, the signal XTM_4MB is activated at the 'L' level and the signal XTM_4RB remains at the 'H' level. At this time, the UP signal becomes the 'H' level and the DN signal remains at the 'L' level during the mode of operation. This makes the signals DMPRSEN_B and DMP_B from the selection signal generating circuit 28 become the 'H' level and the signals DMPRSEN_T and DMP_T therefrom become the 'L' level.

Then, the signal TM_4M from the invertor 54 is at the 'H' level and the signal TM_4R from the invertor 59 is at the 'L' level. The reference word line RWL_B, the reference plate line RPL_B, and the signal RPS_B associated with the second reference cell array 22 are deactivated through the row decoder circuit 26 controlled by the activated signal TM_4M of the 'H' level during the first mode of operation. For example, to do this, drivers (not shown in FIG. 1) for the lines RWL_B and RPL_B and the signal RPS_B are controlled by the signal TM_4M, so that they continue to remain in the deactivated state during the first test mode of operation.

The NMOS transistor 116 of the second voltage dumping circuit 34 is turned on by the signal DMPRSEN_B of the 'H' level, causing a variable test voltage VDMP_B to be supplied into the node ND2 of the second voltage dumping circuit 34 through the voltage transfer circuit 30 in accordance with the signals TM_4M and TM_4R. That is, the capacitor 117 is charged according to the variable test voltage VDMP_B level. And then, as illustrated in FIG. 5, when the signal DMP_B is activated at the 'H' level, a voltage $V_{DMP}$ explained in a following equation as a reference voltage is caused on each bit line, for example, BL1_B and BL2_B:

$$V_{DMP} = \frac{C_{117}}{(2C_{BL} + C_{117})} * VDMP\_B.$$

Herein, $C_{BL}$ indicates a bit line capacitance and $C_{117}$ indicates a capacitance of the capacitor 117 in the second voltage dumping circuit 34.

Next, a sense amplifier circuit 14 senses and amplifies a voltage difference between the bit line pair, for example, BL1_T and BL1_B, in response to the signals SAN and SAP, and data sensed and amplified by the circuit 14 are output through the transistors 108 and 109 switched on by a signal YSW_T to external of the device.

According to the first test mode of operation, by using the voltage dumping circuit 34 as a circuit for providing the bit lines BLiB with reference voltages instead of the second reference cell array 22 that is deactivated, the margin for performance of the ferroelectric capacitors in the first memory cell array 10 can be tested. That is, during the first test mode of operation, since the test voltage VDMP_B supplied through the second voltage dumping circuit 34 under the control of the selection signal generating circuit 28 is varied, the margin for performance of the ferroelectric capacitors in the first memory cell array 10 can be evaluated.

During the second test mode of operation in which the margin for performance of ferroelectric capacitors in the second memory cell array 20 is tested, the second memory cell array 20 is selected (while data stored in each memory cell of the second memory cell array 20 are read out), and the first memory cell array 10 and the second reference cell array 22 are deselected through the row decoder circuit 26. Prior to the test operation performance, bit lines BL1_T to BLi_T and BL1_B to BLi_T are precharged at a predetermined level (for example, 0 volts) by the first and second bit line precharge circuits 16 and 24 in accordance with the signals BLP_T/B of the 'H' level.

As shown in FIG. 5, the signal ICE goes to the 'H' level from the 'L' level, so that the latch circuit 100 of FIG. 2B is reset. During the second test mode of operation, as illustrated in the above-mentioned chart, the signal XTM_4MB is activated at the 'L' level and the signal XTM_4RB remains at the 'H' level. At this time, the DN signal becomes the 'H' level and the UP signal remains at the 'L' level during the mode of operation. This causes the signals DMPRSEN_T and DMP_T from the selection signal generating circuit 28 to become the 'H' level and the signals DMPRSEN_B and DMP_B therefrom become the 'L' level.

Then, the signal TM_4M from the invertor 54 is at the 'H' level and the signal TM_4R from the invertor 59 is at the 'L' level. A reference word line RWL_T, a reference plate line RPL_T, and a signal RPS_T associated with the first reference cell array 12 are deactivated through the row decoder circuit 26 controlled by the activated signal TM_4M of the 'H' level during the second test mode of operation in the same manner as that of the first test mode of operation.

The NMOS transistor 106 of the first voltage dumping circuit 32 is turned on by the signal DMPRSEN_T of the 'H' level, causing a variable test voltage VDMP_T to be supplied into the node ND1 of the first voltage dumping circuit 32 through the voltage transfer circuit 30 in accordance with the signals TM_4M and TM_4R. That is, the capacitor 107 is charged according to the variable test voltage VDMP_T level. Then, as illustrated in FIG. 5, when the signal DMP_T is activated at the 'H' level, the same voltage $V_{DMP}$ as explained in an aforementioned equation as a reference voltage is caused on each bit line, for example, BL1_T and BL2_T.

Next, a sense amplifier circuit 14 senses and amplifies a voltage difference between the bit line pair, for example, BL1_T and BL1_B, in response to the signals SAN and SAP, and data sensed and amplified by the circuit 14 are output through the transistors 118 and 119 switched on by a signal YSW_B to external of the device.

According to the second test mode of operation, by using the first voltage dumping circuit 32 as a circuit for providing the bit lines BLi_T with reference voltages instead of the first reference cell array 12 that is deactivated, the margin for performance of the ferroelectric capacitors in the second memory cell array 20 can be tested. That is, during the second test mode of operation, since the test voltage VDMP_T supplied through the first voltage dumping circuit 32 under the control of the selection signal generating circuit 28 is varied, the margin for performance of the ferroelectric capacitors in the second memory cell array 20 can be evaluated.

As shown in the chart set forth, operations for the third and fourth test modes of operation are performed in the same manner as the first and second test modes of operation except that the reference cell arrays 12 and 22 are tested during the third and fourth test modes of operation and the level of each signal XTM_4MB, XTM_4RB, UP and DN is different from each other, while the memory cell arrays 10 and 20 are tested during the first and second test modes of operation.

Finally, during the fifth test mode of operation in which the sensing margin for the sense amplifier circuit 14 is evaluated, as illustrated in the aforementioned chart, the signals XTM_4MB, XTM_4RB and UP (or XTM_4MB, XTM_4RB and DN) are all activated. As a result, all of the signals DMPRSEN_T, DMPRSEN_B, DMP_T, and DMP_B become the 'H' level. This deactivates the first and second memory cell arrays 10 and 20 and the first and second reference cell array 12 and 22. This is performed by controlling the row decoder circuit 26 according to the aforementioned manner using the signals TM_4M and TM_4R. The first and second voltage dumping circuits 32 and 34 are activated by the selection signal generating circuit 28, and then onto the bit lines BL1_T to BLi_T at the top side and the bit lines BL1_B to BLi_B, variable test voltages VDMP_T and VDMP_B are supplied, respectively. Therefore, by varying the two test voltage VDMP_T/VDMP_B levels, the sensing margin for the sense amplifier circuit 14 can be evaluated during the fifth test mode of operation.

As described above, ferroelectric capacitors of the first and second memory cell arrays 10 and 20 and the first and second reference cell arrays 12 and 22 can be tested by using the on-chip test circuit 40 in FIG. 1, so that a ferroelectric capacitor having low performance can be removed by screening and the yield and/or reliability of the ferroelectric memory device can be enhanced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A nonvolatile integrated circuit memory device comprising:
    a first bit line;
    a word line;
    a nonvolatile memory cell at an intersection of the first bit line and the word line;
    a second bit line corresponding to the first bit line;
    a sense amplifier connected between the first and second bit lines, to sense a voltage difference between the first and second bit lines; and
    a test circuit that receives a variable test voltage and that forces at least one of the first and second bit lines to the variable test voltage in response to control signals during a test mode of operation.

2. The device according to claim 1, wherein the nonvolatile memory cell comprises a ferroelectric capacitor.

3. The device according to claim 1, further comprising a reference cell including a ferroelectric capacitor, wherein the reference cell supplies a reference voltage to the second bit line.

4. The device according to claim 3, wherein the test circuit is responsive to deselection of the word line to force the first bit line to the variable test voltage.

5. The device according to claim 3, wherein the test circuit is responsive to deselection of the reference cell to force the second bit line to the variable test voltage.

6. A nonvolatile integrated circuit memory device comprising:
    a first bit line;
    a word line;
    a nonvolatile memory cell arranged at an intersection of the first bit line and the word line;
    a second bit line corresponding to the first bit line;
    a sense amplifier connected between the first and second bit lines, to sense a voltage difference between the first and second bit lines;
    a reference cell that supplies the second bit line with a reference voltage; and
    a test circuit that is responsive to control signals during a test mode of operation, to receive first and second variable test voltages and force the first and second bit lines to the first and second test voltages, respectively, wherein the test circuit is responsive to deselection of the nonvolatile memory cell and the reference cell to supply the first and second bit lines with the first and second test voltages.

7. The device according to claim 6, wherein the nonvolatile memory cell and the reference cell each comprises a ferroelectric capacitor.

8. A ferroelectric memory device comprising:
    a first memory cell array having a plurality of first word lines, a plurality of first bit lines, and a plurality of first nonvolatile memory cells arranged respectively at intersections of the first word lines and the first bit lines;
    a plurality of second bit lines corresponding to the first bit lines, respectively;
    a first reference cell array having a first reference word line and a plurality of first reference cells, to generate first reference voltages that are supplied to the second bit lines;
    a row decoder circuit that selects a first word line related to a selected nonvolatile memory cell and the first reference word line in response to address signals;
    a sense amplifier circuit connected between the first and second bit lines, that senses a voltage difference between the first and second bit lines associated with the selected nonvolatile memory cell; and
    a test circuit that receives at least one variable test voltage to force at least one of the first and second bit lines to the at least one variable test voltage in response to first and second control signals during a test mode of operation.

9. The device according to claim 8, wherein each of the first nonvolatile memory cells and the first reference cells comprises a ferroelectric capacitor and a switching transistor.

10. The device according to claim 8, further comprising a second memory cell array connected to the second bit lines and having a plurality of second word lines and a plurality of second nonvolatile memory cells arranged respectively at intersections of the second word lines and the second bit lines; and
    a second reference cell array connected to the first bit lines and having a second reference word line and a plurality of second reference cells, to generate second reference voltages that are supplied into the first bit lines, respectively.

11. The device according to claim 10, wherein the test circuit is responsive to deselection of the second memory cell array and the first and second reference cell arrays to supply at least one of the second bit lines with the variable test voltage.

12. The device according to claim 10, wherein the test circuit is responsive to deselection of the first memory cell array and the first and second reference cell arrays to supply at least one of the first bit lines with the variable test voltage.

13. The device according to claim 10, wherein the test circuit is responsive to deselection of the first and second memory cell arrays and the first reference cell array to supply at least one of the second bit lines with the variable test voltage.

14. The device according to claim 10, wherein the test circuit is responsive to deselection of the first and second memory cell arrays and the second reference cell array to supply at least one of the first bit lines with the variable test voltage.

15. The device according to claim 10, wherein two variable test voltages are supplied to the test circuit, and wherein the test circuit is responsive to deselection of the first and second memory cells and the first and second reference cell arrays to supply the first and second bit lines with the two test voltages respectively.

16. The device according to claim 15, wherein the test circuit comprises:
   a first circuit connected to the first bit lines, that dumps one of the two test voltages into the first bit lines in response to first and second selection signals;
   a second circuit connected to the second bit lines, that dumps the other one of the two test voltages into the second bit lines in response to third and fourth selection signals;
   a voltage transfer circuit that transfers two variable test voltages into the first and second circuits respectively in response to fifth and sixth selection signals; and
   a selection signal generating circuit that receives the control signals to generate the first to sixth selection signals.

17. The device according to claim 16, wherein the selection signal generating circuit generates the first to fourth selection signals when either the second memory cell array or the first reference cell array is selected during the test mode of operation, wherein the first selection signal is enabled prior to the second selection signal.

18. The device according to claim 16, wherein the selection signal generating circuit generates the third to sixth selection signals when either the first memory cell array or the second reference cell array is selected during the test mode of operation, wherein the third selection signal is enabled prior to the fourth selection signal.

19. A method of testing a nonvolatile integrated circuit memory device comprising a first bit line, a word line, a nonvolatile memory cell at an intersection of the first bit line and the word line, a second bit line corresponding to the first bit line, and a sense amplifier connected between the first and second bit lines to sense a voltage difference between the first and second bit lines, the method comprising the steps of:
   receiving a variable test voltage; and
   forcing at least one of the first and second bit lines to the variable test voltage in response to control signals during a test mode of operation.

20. The method according to claim 19, wherein the nonvolatile memory cell comprises a ferroelectric capacitor.

21. The method according to claim 19, further comprising a reference cell including a ferroelectric capacitor, wherein the reference cell supplies a reference voltage to the second bit line.

22. The method according to claim 21, wherein the forcing step is responsive to deselection of the word line to force the first bit line to the variable test voltage.

23. The method according to claim 21, wherein the forcing step is responsive to deselection of the reference cell to force the second bit line to the variable test voltage.

24. A method of testing a nonvolatile integrated circuit memory device comprising a first bit line, a word line, a nonvolatile memory cell arranged at an intersection of the first bit line and the word line, a second bit line corresponding to the first bit line, a sense amplifier connected between the first and second bit lines to sense a voltage difference between the first and second bit lines, and a reference cell that supplies the second bit line with a reference voltage, the method comprising the steps of:
   receiving first and second variable test voltages in response to control signals during a test mode of operation; and
   forcing the first and second bit lines to the first and second test voltages, respectively, in response to deselection of the nonvolatile memory cell and the reference cell.

25. The method according to claim 24, wherein the nonvolatile memory cell and the reference cell each comprises a ferroelectric capacitor.

26. A method of testing a ferroelectric memory device comprising a first memory cell array having a plurality of first word lines, a plurality of first bit lines, and a plurality of first nonvolatile memory cells arranged respectively at intersections of the first word lines and the first bit lines, a plurality of second bit lines corresponding to the first bit lines, respectively, a first reference cell array having a first reference word line and a plurality of first reference cells, to generate first reference voltages that are supplied to the second bit lines, a row decoder circuit that selects a first word line related to a selected nonvolatile memory cell and the first reference word line in response to address signals and a sense amplifier circuit connected between the first and second bit lines that senses a voltage difference between the first and second bit lines associated with the selected nonvolatile memory cell, the method comprising the steps of:
   receiving at least one variable test voltage; and
   forcing at least one of the first and second bit lines to the at least one variable test voltage in response to first and second control signals during a test mode of operation.

27. The method according to claim 26, wherein each of the first nonvolatile memory cells and the first reference cells comprises a ferroelectric capacitor and a switching transistor.

28. The method according to claim 26, further comprising a second memory cell array connected to the second bit lines and having a plurality of second word lines and a plurality of second nonvolatile memory cells arranged respectively at intersections of the second word lines and the second bit lines; and
   a second reference cell array connected to the first bit lines and having a second reference word line and a plurality of second reference cells, to generate second reference voltages that are supplied into the first bit lines, respectively.

29. The method according to claim 28, wherein the forcing step is responsive to deselection of the second memory cell array and the first and second reference cell arrays to supply at least one of the second bit lines with the variable test voltage.

30. The method according to claim 28, wherein the forcing step is responsive to deselection of the first memory cell array and the first and second reference cell arrays to supply at least one of the first bit lines with the variable test voltage.

31. The method according to claim 28, wherein the forcing step is responsive to deselection of the first and second memory cell arrays and the first reference cell array to supply at least one of the second bit lines with the variable test voltage.

32. The method according to claim 28, wherein the forcing step is responsive to deselection of the first and second memory cell arrays and the second reference cell array to supply at least one of the first bit lines with the variable test voltage.

33. The device according to claim 28, wherein the receiving step comprises the step of receiving two variable test voltages, and wherein the forcing step is responsive to deselection of the first and second memory cells and the first and second reference cell arrays to force the first and second bit lines to the two test voltages respectively.

* * * * *

UNITED STATES PATENT AND TRADEMARK OFFICE
CERTIFICATE OF CORRECTION

PATENT NO. : 6,055,200
DATED : April 25, 2000
INVENTOR(S) : Choi et al.

It is certified that error appears in the above-identified patent and that said Letters Patent is hereby corrected as shown below:

On the title page, item:

[56] References Cited - please add the following:

| | | | |
|---|---|---|---|
| 5,541,872 | 7/1996 | Lowrey et al. | 365/145 |
| 5,218,566 | 6/1993 | Papaliolios | 365/145 |
| 4,873,664 | 10/1989 | Eaton, Jr. | 365/145 |

Signed and Sealed this

Sixth Day of March, 2001

Attest:

NICHOLAS P. GODICI

Attesting Officer    Acting Director of the United States Patent and Trademark Office